United States Patent
Lee et al.

(12) 
(10) Patent No.: US 7,121,326 B2
(45) Date of Patent: Oct. 17, 2006

(54) HEAT SINK

(75) Inventors: Hsieh-Kun Lee, Tu-Cheng (TW); Cheng-Tien Lai, Tu-Cheng (TW); Zhi-Yong Zhou, Shenzhen (CN)

(73) Assignee: Foxconn Technology Co., Ltd., Taipei Hsien (TW)

( * ) Notice: Subject to any disclaimer, the term of this patent is extended or adjusted under 35 U.S.C. 154(b) by 0 days.

(21) Appl. No.: 11/135,222

(22) Filed: May 24, 2005

(65) Prior Publication Data

US 2006/0118276 A1   Jun. 8, 2006

(30) Foreign Application Priority Data

Dec. 3, 2004   (CN) .................. 2004 2 0102392

(51) Int. Cl.
*H05K 7/20* (2006.01)
(52) U.S. Cl. ..................... 165/80.3; 361/704
(58) Field of Classification Search .............. 165/80.3, 165/185; 361/704, 710
See application file for complete search history.

(56) References Cited

U.S. PATENT DOCUMENTS

| | | | |
|---|---|---|---|
| 6,607,023 B1 * | 8/2003 | Ho et al. | 165/78 |
| 6,639,802 B1 | 10/2003 | Dong et al. | |
| 6,729,384 B1 * | 5/2004 | Lo | 165/80.3 |
| 6,754,079 B1 * | 6/2004 | Chang | 361/709 |
| 6,880,621 B1 * | 4/2005 | Wang | 165/80.3 |
| 6,901,993 B1 * | 6/2005 | Lee et al. | 165/80.3 |
| 6,942,026 B1 * | 9/2005 | Lin et al. | 165/185 |
| 2004/0159421 A1 * | 8/2004 | Wang | 165/80.3 |
| 2004/0194925 A1 * | 10/2004 | Lee et al. | 165/80.3 |
| 2004/0207984 A1 * | 10/2004 | Huang et al. | 361/703 |
| 2004/0231827 A1 * | 11/2004 | Fu et al. | 165/80.3 |
| 2005/0115702 A1 * | 6/2005 | Lin et al. | 165/185 |

FOREIGN PATENT DOCUMENTS

| | | |
|---|---|---|
| CN | 02250745.0 | 12/2003 |
| CN | 03200694.2 | 1/2004 |
| TW | 545878 | 8/2003 |
| TW | 545882 | 8/2003 |
| TW | 557109 | 10/2003 |

* cited by examiner

*Primary Examiner*—Allen J. Flanigan
(74) *Attorney, Agent, or Firm*—Tim Tingkang Xia; Morris Manning Martin LLP

(57) ABSTRACT

A heat sink comprises a plurality of stacked fins being combined. Each fin comprises a plate body with two pairs of locking structures formed symmetrically on two opposite edges of the plate body. Each locking structure comprises an interval part extending integratedly from the plate body, a bearing part depending from the interval part, a lateral position portion and a detaining portion extend continuously from the bearing part. A tab is formed on each detaining portion. The fins are combined in such a manner that the bearing part of each fin bears against an adjacent fin; the plate body of each fin is sandwiched between the bearing part and the detaining portion of each locking structure of an adjacent fin, and between the lateral position portions of a pair of locking structures of the adjacent fin, the tabs of each fin bear against the corresponding interval parts of the adjacent fin.

15 Claims, 4 Drawing Sheets

HEAT SINK

BACKGROUND OF THE INVENTION

1. Field of the Invention

The present invention generally relates to a heat sink for removing heat from electronic components and particularly to a heat sink comprising a plurality of interlocked fins.

2. Prior Art

With the continuing development of electronics technology, new electronic components can perform more and more functions. Heat generated by modern electronic components has increased commensurately. Measures must be taken to efficiently remove the heat from the electronic components. Typically, a heat sink having great heat conductivity is mounted on the electronic component to remove heat therefrom.

A conventional heat sink comprises a base plate in thermal contact with the electronic component, and a plurality of fins mounted on the base plate. The fins each have an L-shaped profile. When the heat sink is subjected to accidental force, the fins are liable to be crushed together. To overcome this problem, heat sinks having C-shaped fins have been devised. FIG. 5 illustrates a conventional C-shaped fins heat sink comprising a plurality of metal plates 11a, each of which is formed in a same shape and size by means of conventional mechanical pressing. Each metal plate 11a comprises a main body 12a with an upper flange and a lower flange 13a arranged in a parallel manner. The metal plates 11a are connected with a surface of a thermal conductive metal substrate 20a. To position the metal plates 11a, protruding portions 14a and corresponding recess portions 15a are provided on each upper and lower flanges 13a. The metal plates 11a are stacked in position by engaging the protruding portions 14a of a metal plate 11a with the corresponding recess portions 15a of an adjacent metal plates 11a. However, such a positioning mechanism provides poor combination. Sometimes, metal plates 11a fall off due to collision.

The above-mentioned heat sink has not a firm joint between two adjacent metal plates. The combined fins group is incompetent to resist outside force and is prone to deform. Accordingly, there is a need for an improved heat sink that has good reliability.

SUMMARY OF THE INVENTION

Accordingly, what is needed is to provide a heat sink having a plurality of fins that are easily and securely interlocked.

A heat sink of a preferred embodiment of the present invention comprises a plurality of stacked fins. Each fin comprises a plate body with two pairs of locking structures formed symmetrically on two opposite edges of the plate body. Each locking structure comprises an interval part extending integratedly from the plate body, a bearing part depending from the interval part, a lateral position portion and a detaining portion extend continuously from the bearing part. A tab is formed on each detaining portion. The fins are combined in such a manner that the bearing parts of each fin bear against an adjacent fin; the plate body of each fin is sandwiched between the bearing part and the detaining portion of a locking structure of an adjacent fin, and between the lateral position portions of a pair of locking structures of the adjacent fin, the tabs of each fin bear against the corresponding interval parts of the adjacent fin.

The foregoing and other features of the invention will become apparent from the following description of embodiments of the invention with reference to the accompanying drawings, in which:

DETAILED DESCRIPTION OF THE INVENTION

Figure 1:
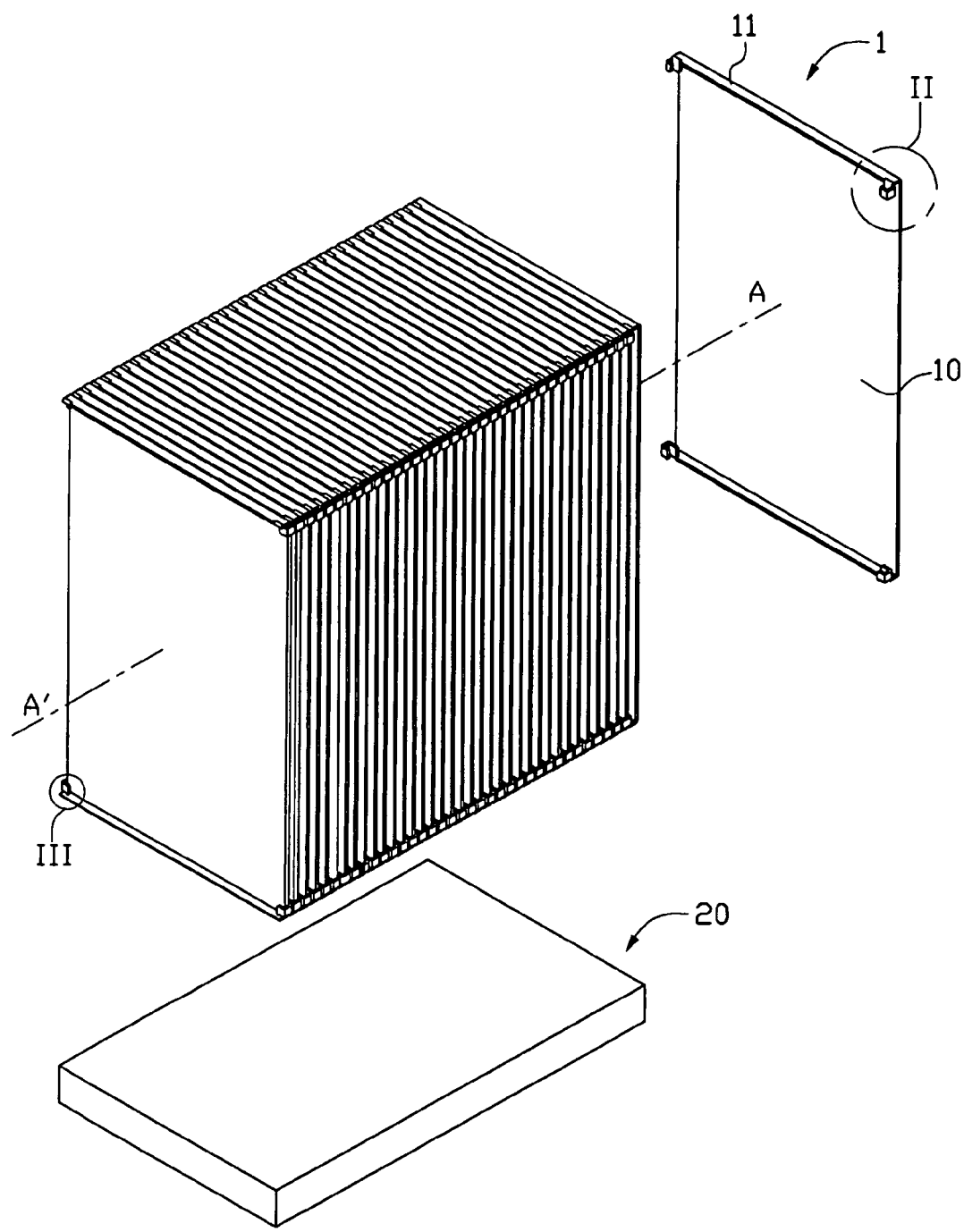
FIG. 1 is a partial-exploded isometric view of a heat sink in accordance with a preferred embodiment of the present invention.

In the following detailed description of the embodiment, reference is made to the accompanying drawings that illustrate embodiment of the present invention and its practice. FIG. 1 shows a heat sink of a heat dissipating device for dissipating heat generated by an electronic component (not shown). The heat sink comprises a plurality of identical fins 1 capable of being stacked and combined together.

Figure 2:
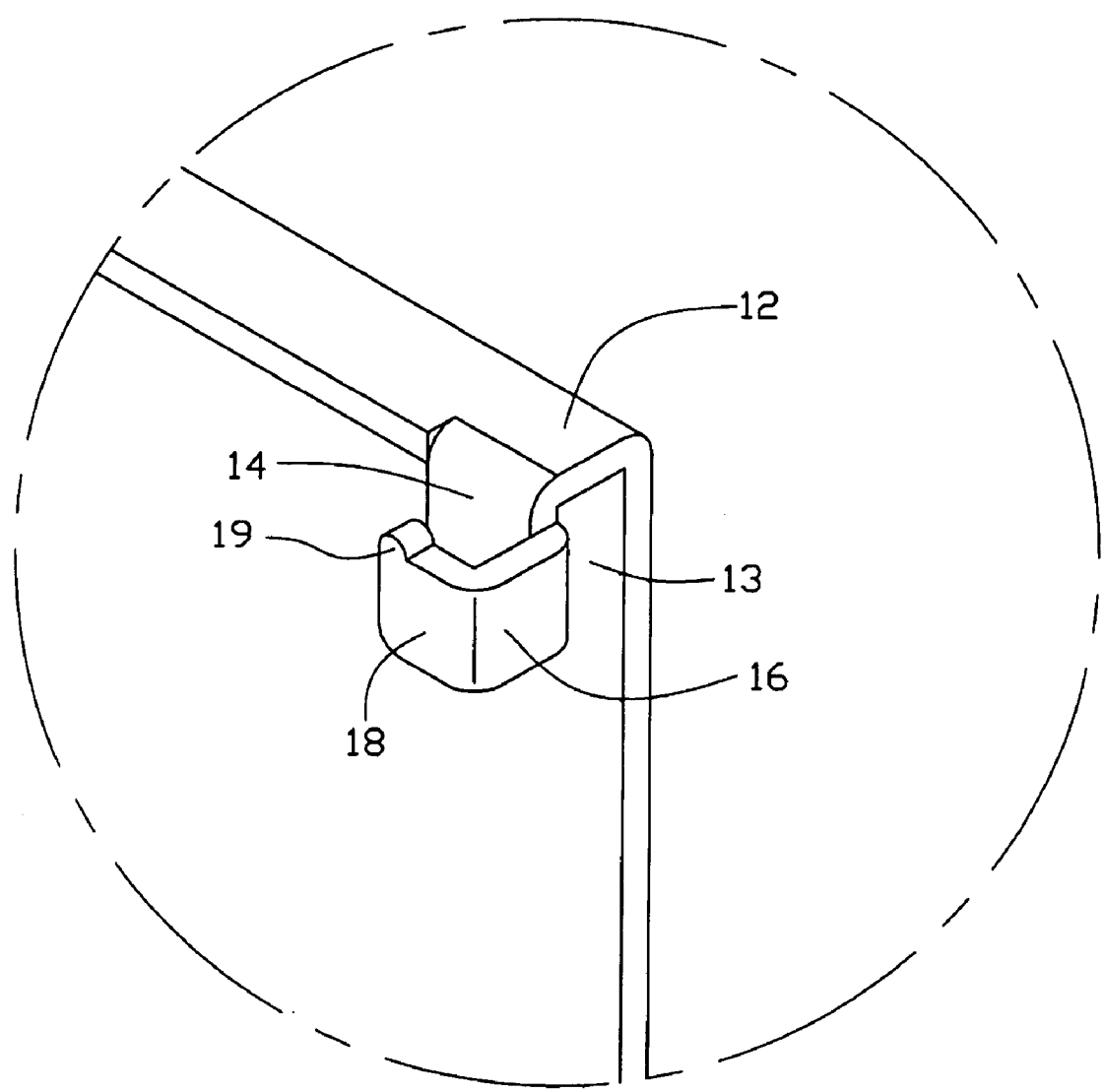
FIG. 2 is an enlarged view of a circled portion II in FIG. 1.

Referring also FIG. 1 and FIG. 2, each fin 1 comprises a square metal plate body 10 with two pairs of locking structures for locking itself to an adjacent fin 1. The two pairs of locking structures are formed on two opposite edges of the plate body 10 symmetrically, and each pair of locking structures is also constructed near to end of a corresponding edge of the plate body 10 symmetrically.

Particularly referring to FIG. 2, each locking structure comprises an interval part 12 extending perpendicularly from an edge of the plate body 10, and a bearing part 14 depending from the interval part 12 and parallel to the plate body 10. A receiving space 13 is defined among the interval part 12, the bearing part 14 and the plate body 10. A lateral position portion 16 extends perpendicularly from an outer side of the bearing part 14 and away from the plate body 10. A detaining portion 18 extends continuously from the lateral position portion 16. The detaining portion 18 is perpendicular to the lateral position portion 16 and parallel to the bearing part 14. A tab 19 protrudes from a free edge of the detaining portion 18. For strengthening the locking structures, a flange 11 extends perpendicularly from the edge of the plate body 10 between each pair of locking structures. The flange 11 connects the interval parts 12 of each pair of locking structures.

Figure 3:
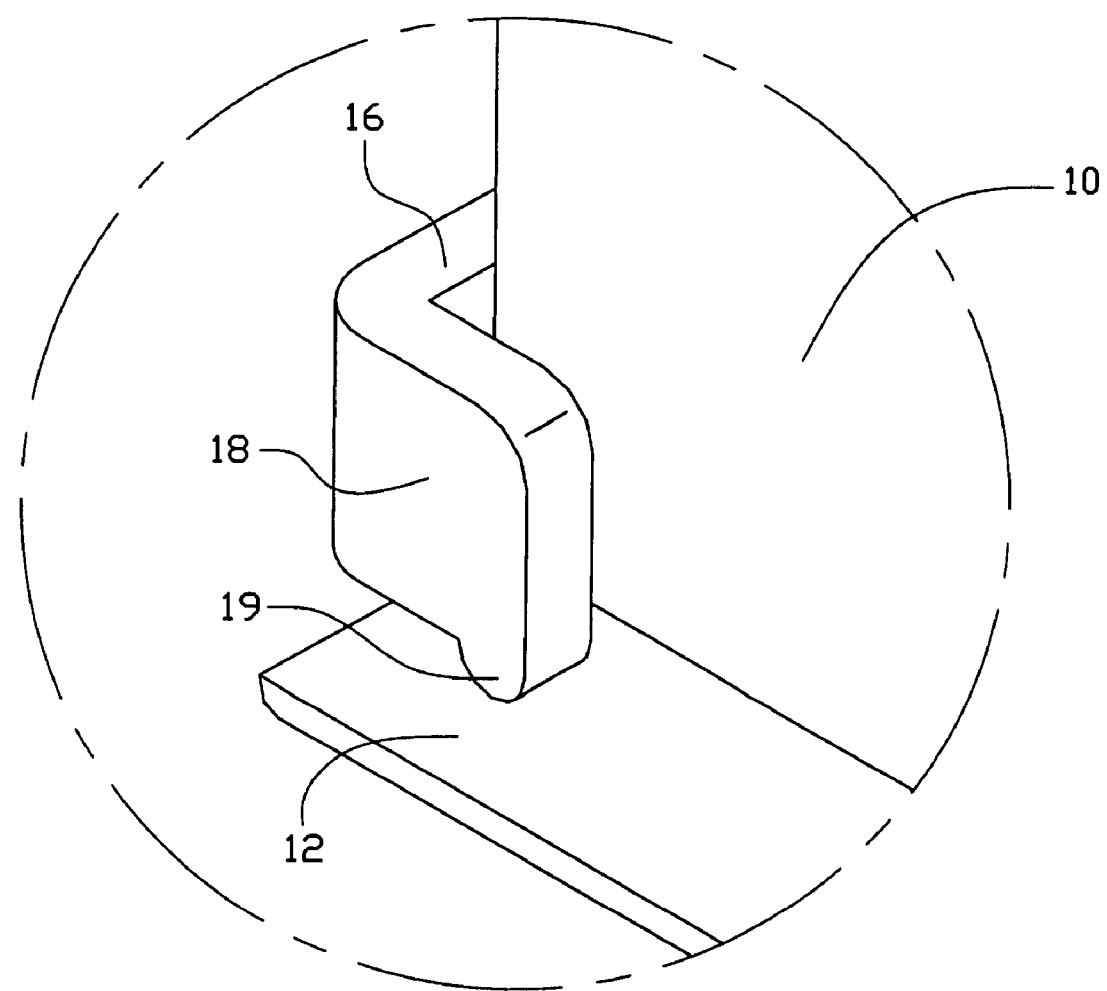
FIG. 3 is an enlarge view of a circled portion III in FIG. 1.
Figure 4:
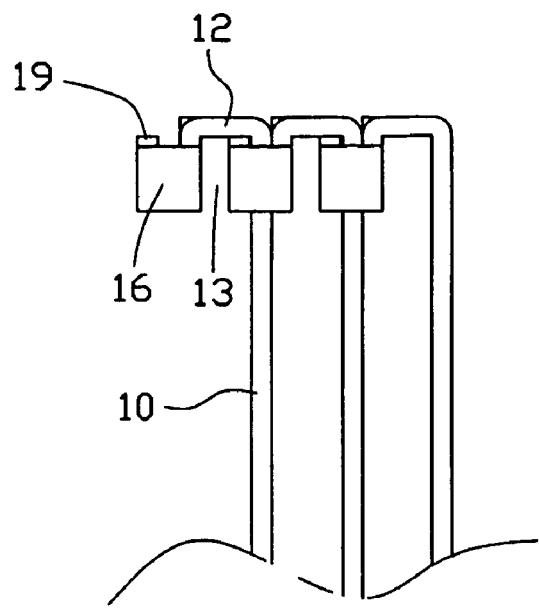
FIG. 4 is a side elevational view illustrating three interlocked fins of the heat sink of FIG. 1.
Figure 5:
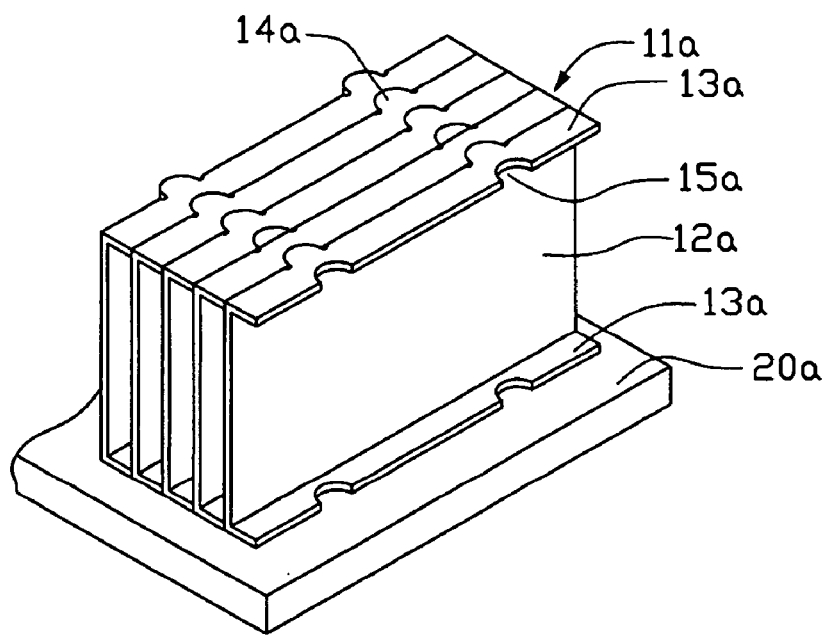
FIG. 5 is an isometric view of a conventional heat sink.

Please refer to FIG. 1 and FIGS. 3–4. In combination, all of the fins 1 are stacked, being parallel to each other, along a virtual straight line A–A' that extends through a center point of each fin 1 and is perpendicular to the plate body 10. Each fin 1 is combined with an adjacent front fin 1. The bearing parts 14 of each fin 1 bear against the plate body 10 of the adjacent front fin 1. The detaining portions 18 of each fin 1 extend in the receiving spaces 13 of the adjacent front fin while the plate body 10 of the adjacent front fin 1 is sandwiched between the bearing part 14 and detaining portion 18 of each locking structure of the fin 1, and between a pair of lateral position portions 16 thereof. As a result, each fin 1 hugs the plate body 10 of the adjacent front fin 1 by locking structures. The tabs 19 of each fin 1 bear against the corresponding interval parts 12 of the front adjacent fin 1. A fin assembly comes into being.

In the fin assembly, the interval parts 12 of each fin 1 space itself from the adjacent front fin 1, this prevents the fin assembly from being compressed. The plate body 10 of the adjacent fin 1 is sandwiched tightly between the bearing part 14 and the detaining portion 16 of each locking structure of the fin 1, this prevents the fin assembly from being broken away. The lateral position portions 16 of each pair of locking structure of each fin 1 sandwich the plate body of the adjacent fin 1 therebetween, this prevents the fin 1 from moving right and left relative to the front fin 1. The tabs 19 of each fin 1 bear against the interval parts 12 of the adjacent front fin 1, this prevents the fin 1 from moving up and down relative to the adjacent front fin 1. All of fins 1 are combined to a whole fin group and positioned firmly at uniform distance.

In the description of above fin assembly, when an outside force is exerted, each fin 1 positions itself in the fin group by locking structures, preventing the fins group from disengaging, falling off in every direction and deformation.

The fin group can be attached to a conductive base 20 in a manner that the interval parts 12 of and flanges 11 each fin 1 adheres to the base 20 by soldering, paste or the like.

In the preferred embodiment, the flanges 11 connecting each pair of interval parts 12 are provided for strengthening the pair of locking structures, and further for adhering to the base 20 to facilitate heat conducting from the base 20 to the fins 1. It is feasible that the flanges 11 can be omitted in other embodiment.

It is recognized that the invention may be susceptible to various other modifications and alternative constructions in view of this disclosure. Although the invention has been shown and described in detail herein by a preferred embodiment and certain alternatives, it should be understood that there is no intention of limiting the invention strictly to this. But rather it is the intention to cover all such other modifications and alternative constructions falling within the spirit and scope of the invention as defined in the appended claims.

We claim:

1. A heat sink comprising:
    a plurality of stacked fins, each fin comprising:
        a plate body with two opposite edges;
        two pairs of locking structures extending symmetrically from the opposite edges of the plate body, each locking structure comprising:
            an interval part substantially perpendicular to the plate body;
            a bearing part depending from the interval part;
            a lateral position portion extending from the bearing part and away from the plate body; and
            a detaining portion extending from the lateral position portion, a tab protruding on the detaining portion;
    wherein the bearing parts bear against the plate body of an adjacent fin, the plate body of the adjacent fin is sandwiched between the lateral position portions of each pair of the locking structures and between the bearing part and a corresponding detaining portion of each locking structure of each fin, the tabs of each fin bear against the interval parts of the adjacent fin.

2. The heat sink as claimed in claim 1, wherein each pair of the locking structure is disposed near two ends of a corresponding edge of the plate body.

3. The heat sink as claimed in claim 2, wherein the bearing part is parallel to the plate body.

4. The heat sink as claimed in claim 3, wherein a receiving space is provided between the plate body, the interval part and the bearing part.

5. The heat sink as claimed in claim 4, wherein a flange connecting each pair of the locking structures extends from the plate body.

6. The heat sink as claimed in claim 5, further comprising a base to which the flanges of the fins are attached.

7. The heat sink as claimed in claim 3, wherein the lateral position portion extends perpendicularly from an outer side of the bearing part and away from the plate body.

8. A heat sink comprising:
    a plurality of stacked fins each comprising a plate body with two pairs of symmetrical locking structures for locking the fin to an adjacent fin, each locking structure comprising:
        an interval part, a bearing part, a lateral position portion and a detaining portion extending continuously from the plate body, a tab being formed on the detaining portion,
    wherein the plate body of each fin is sandwiched between the bearing part and the detaining portion of a locking structure of an adjacent fin, and between the lateral position portions of a pair of locking structure of the adjacent fin, the tabs of each fin bear against the corresponding interval parts of the adjacent fin.

9. The heat sink as claimed in claim 8, wherein the two pairs of locking structures extend from two opposite edges of the plate body.

10. The heat sink as claimed in claim 9, wherein the interval parts extend substantially perpendicularly from the edges of the plate body.

11. The heat sink as claimed in claim 8, wherein the bearing parts depend from the interval parts and are parallel to the plate body.

12. The heat sink as claimed in claim 11, wherein the lateral position portions extend substantially perpendicularly from an outer sides of the bearing parts and away from the plate body.

13. The heat sink as claimed in claim 12, wherein the detaining portions extend from the lateral position portions, parallel to the bearing parts.

14. The heat sink as claimed in claim 10, wherein a flange connecting each pair of interval parts extends from the plate body.

15. The heat sink as claimed in claim 12, further comprising a base to which the flanges of the fins are attached.

* * * * *